(12) United States Patent
Chen et al.

(10) Patent No.: US 8,766,288 B2
(45) Date of Patent: Jul. 1, 2014

(54) DISPLAY PANEL AND MANUFACTURING METHOD THEREOF

(75) Inventors: Peng-Yu Chen, Hsin-Chu (TW); Lun Tsai, Hsin-Chu (TW); Chih-Lei Chen, Hsin-Chu (TW); Shu-Yu Chou, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 59 days.

(21) Appl. No.: 13/436,994

(22) Filed: Apr. 2, 2012

(65) Prior Publication Data

US 2013/0134449 A1    May 30, 2013

(30) Foreign Application Priority Data

Nov. 29, 2011   (TW) .............................. 100143700 A

(51) Int. Cl.
*H01L 51/52*      (2006.01)
*H01L 51/56*      (2006.01)
*H01L 27/32*      (2006.01)

(52) U.S. Cl.
CPC ................. *H01L 51/52* (2013.01); *H01L 51/56* (2013.01); *H01L 27/32* (2013.01)
USPC .. 257/88; 438/34; 257/E33.062; 257/E27.121

(58) Field of Classification Search
USPC .......................................................... 438/99
See application file for complete search history.

(56) References Cited

U.S. PATENT DOCUMENTS

| 7,985,609 | B2 | 7/2011 | Ito | |
|---|---|---|---|---|
| 8,168,983 | B2 * | 5/2012 | Yagi | 257/72 |
| 2008/0067930 | A1 | 3/2008 | Chung | |
| 2008/0233827 | A1 * | 9/2008 | Kagami et al. | 445/24 |
| 2008/0241768 | A1 * | 10/2008 | Takagi et al. | 430/348 |
| 2009/0189523 | A1 * | 7/2009 | Lee et al. | 313/504 |
| 2009/0215350 | A1 | 8/2009 | Takei | |
| 2010/0097295 | A1 | 4/2010 | Kwak | |
| 2011/0031500 | A1 | 2/2011 | Suh | |
| 2012/0187425 | A1 * | 7/2012 | Omoto | 257/88 |

FOREIGN PATENT DOCUMENTS

| CN | 101728419 A | 6/2010 |
|---|---|---|
| CN | 101997022 A | 3/2011 |

* cited by examiner

*Primary Examiner* — Fernando L Toledo
*Assistant Examiner* — Valerie N Newton
(74) *Attorney, Agent, or Firm* — Winston Hsu; Scott Margo

(57) ABSTRACT

A display panel includes a substrate, a plurality of bottom electrodes, an isolation layer, a plurality of light emitting layers, a top electrode, and at least one first auxiliary electrode. The bottom electrodes and the isolation layer are disposed on the substrate. The isolation layer has a plurality of pixel region openings and at least one buffer region. Each of the pixel region openings respectively exposes the corresponding bottom electrode. The buffer region is disposed between two adjacent pixel region openings. The light emitting layers are respectively disposed on the corresponding bottom electrodes. The top electrode covers the light emitting layers, the isolation layer, and the buffer region. The first auxiliary electrode is disposed in the buffer region.

24 Claims, 10 Drawing Sheets

DISPLAY PANEL AND MANUFACTURING METHOD THEREOF

BACKGROUND OF THE INVENTION

1. Field of the Invention

The present invention relates to a display panel and a manufacturing method thereof, and more particularly, to a display panel including an auxiliary electrode and a manufacturing method thereof.

2. Description of the Prior Art

Because of certain advantages, such as being color filter free, self-lighting, backlight module free, and having low power consumption, the electroluminescent display devices are regarded as a front runner to replace the conventional liquid crystal display devices and become the mainstream display products of the next generation. Organic light emitting diode (OLED) display technology may be the most mature technology among all the electroluminescent display technologies.

According to the differences in structures and light emitting directions, the OLED display panels are generally divided into top emission OLED display panels and bottom emitting OLED display panels. In the top emission OLED display panel, a thin metal layer or a transparent conductive layer covering the entire display panel is generally employed as a top electrode to enhance the light emitting effect and increase the luminous efficacy. However, the top electrode made of thin metal layers or transparent conductive layers has to be enlarged when applied in large-sized OLED display panels, and problems, such as internal resistance, may cause IR drop. The uniformity of luminance of each region on the display panel may then be influenced, and the problem may be an obstacle to the development of larger-sized OLED display panels.

SUMMARY OF THE INVENTION

One of the objectives of the present invention is to provide a display panel and a manufacturing method thereof. An auxiliary electrode is employed in the display panel and related structures are modified, so as to improve the IR drop. The purposes of improving the uniformity of luminance of the display panel and simplifying the manufacturing processes may accordingly be achieved.

To achieve the purposes described above, a preferred embodiment of the present invention provides a display panel. The display panel includes a substrate, a plurality of bottom electrodes, an isolation layer, a plurality of light emitting layers, a top electrode, and at least one first auxiliary electrode. The bottom electrodes and the isolation layer are disposed on the substrate. The isolation layer has a plurality of pixel region openings and at least one buffer region. Each of the pixel region openings respectively exposes the corresponding bottom electrode. The buffer region is disposed between two adjacent pixel region openings. The light emitting layers are respectively disposed on the corresponding bottom electrodes. The top electrode is disposed on the substrate. The top electrode covers the light emitting layers, the isolation layer, and the buffer region. The first auxiliary electrode is disposed in the buffer region.

To achieve the purposes described above, a preferred embodiment of the present invention provides a manufacturing method of a display panel. The manufacturing method of the display panel includes the following steps. A substrate is provided. A plurality of bottom electrodes is formed on the substrate. An isolation layer is formed on the substrate. The isolation layer has a plurality of pixel region openings and at least one buffer region. Each of the pixel region openings respectively exposes the corresponding bottom electrode, and the buffer region is disposed between two adjacent pixel region openings. A plurality of light emitting layers is formed in the pixel region openings. A top electrode is formed and covers the light emitting layers, the isolation layer, and the buffer region. At least one first auxiliary electrode is formed in the buffer region, and the first auxiliary electrode is electrically connected to the top electrode.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Figure 1A:
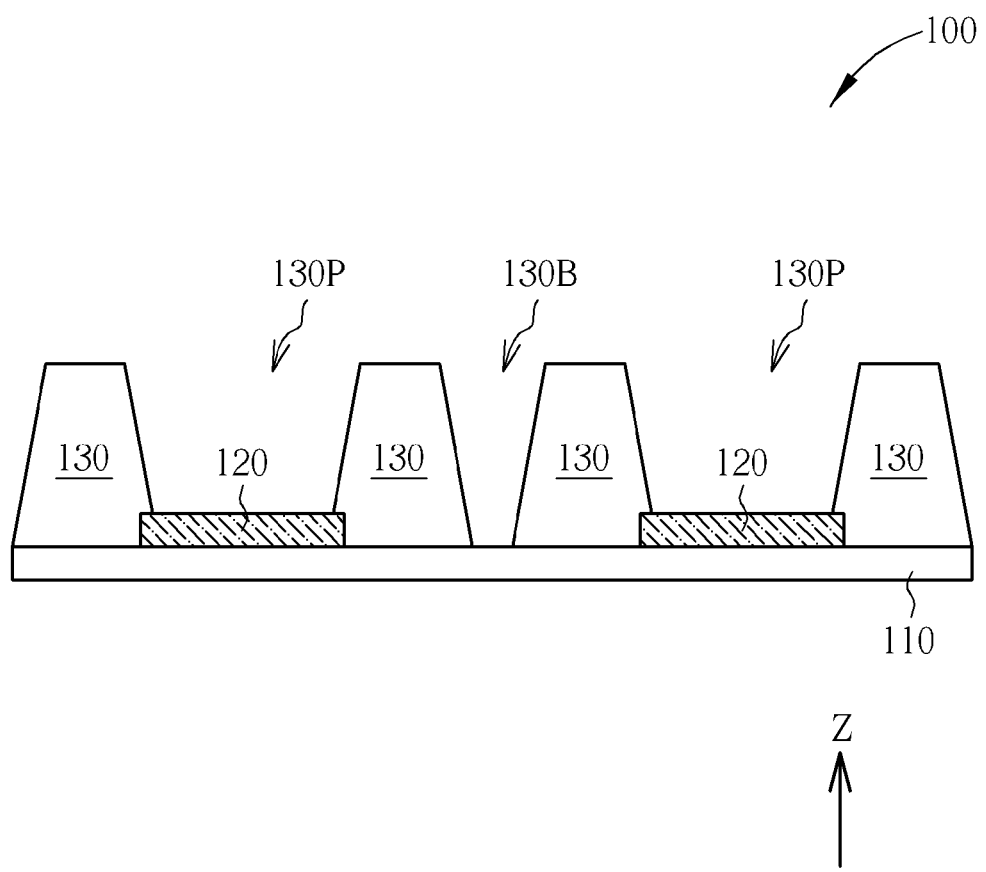
FIG. 1A, FIG. 1B, and FIG. 2A are schematic diagrams illustrating a manufacturing method of a display according to a first preferred embodiment of the present invention.
Figure 1B:
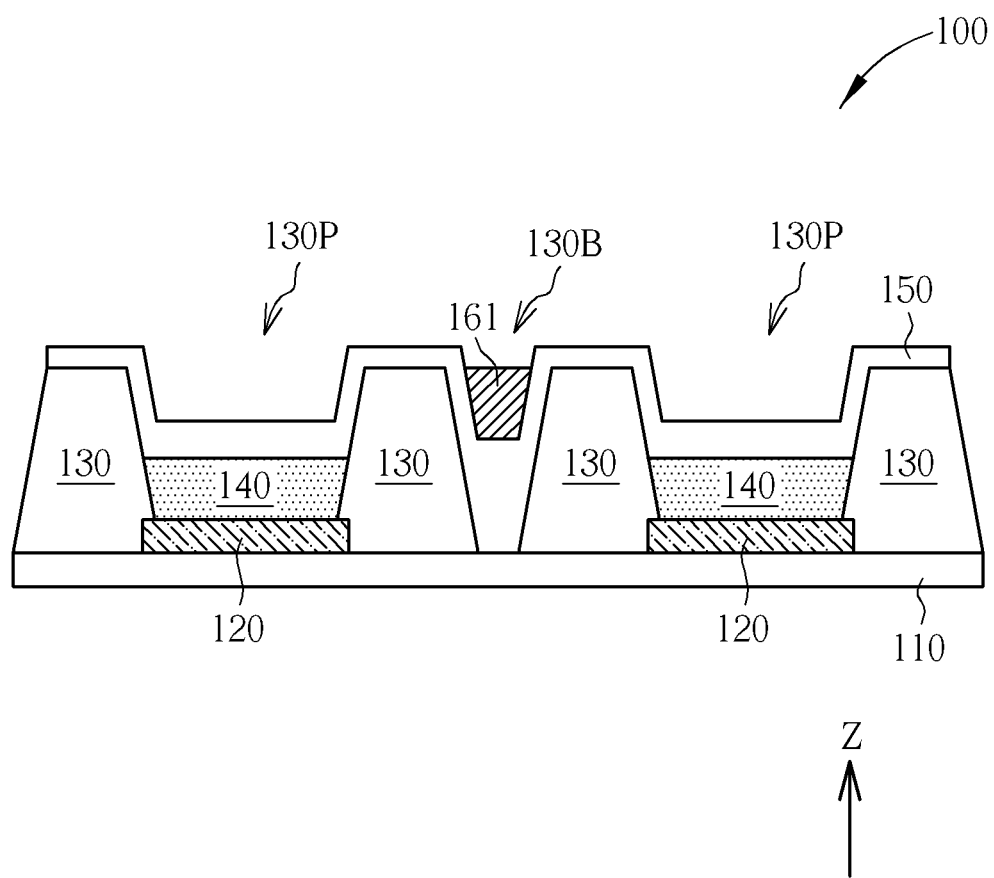
Figure 2A:
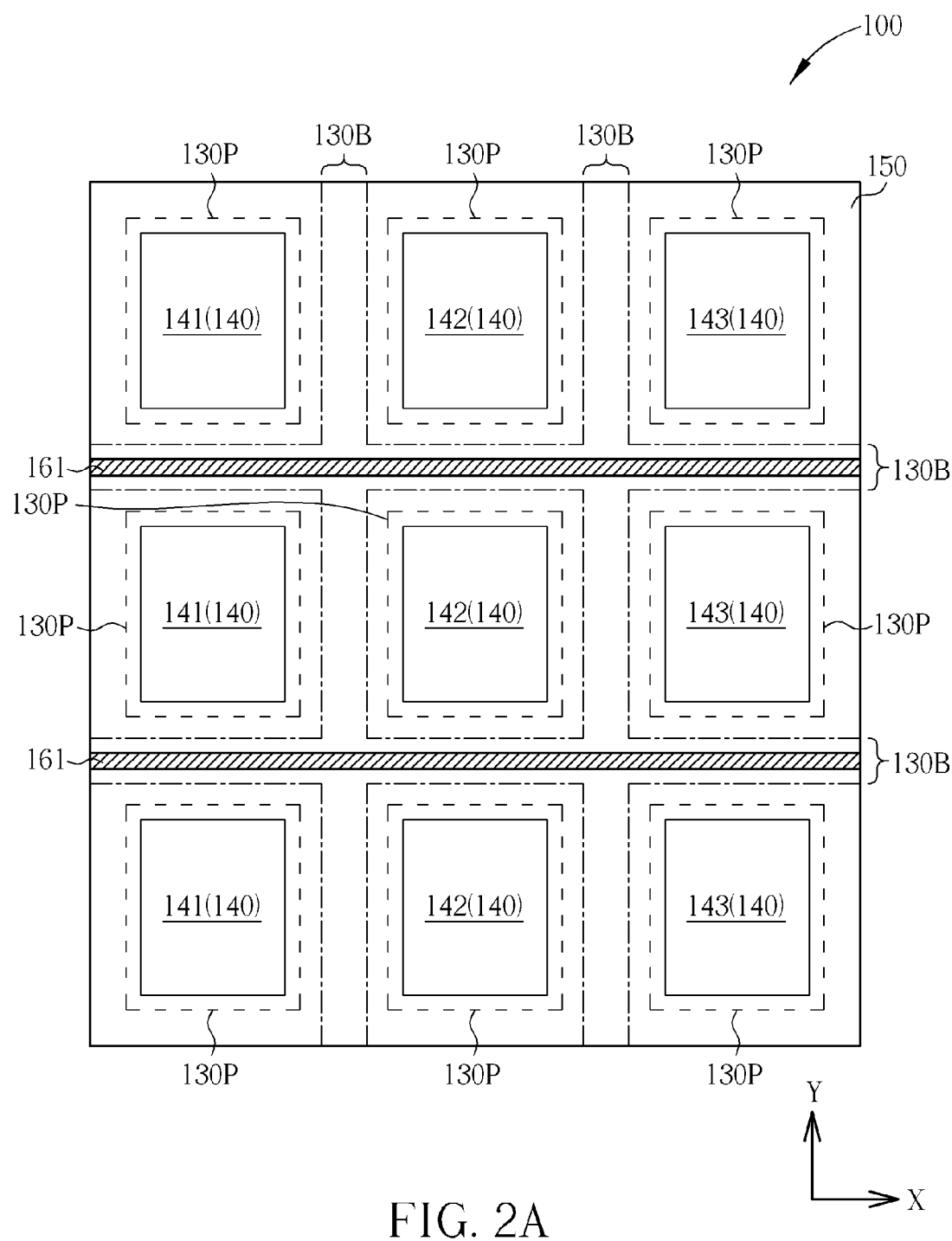
Figure 2B:
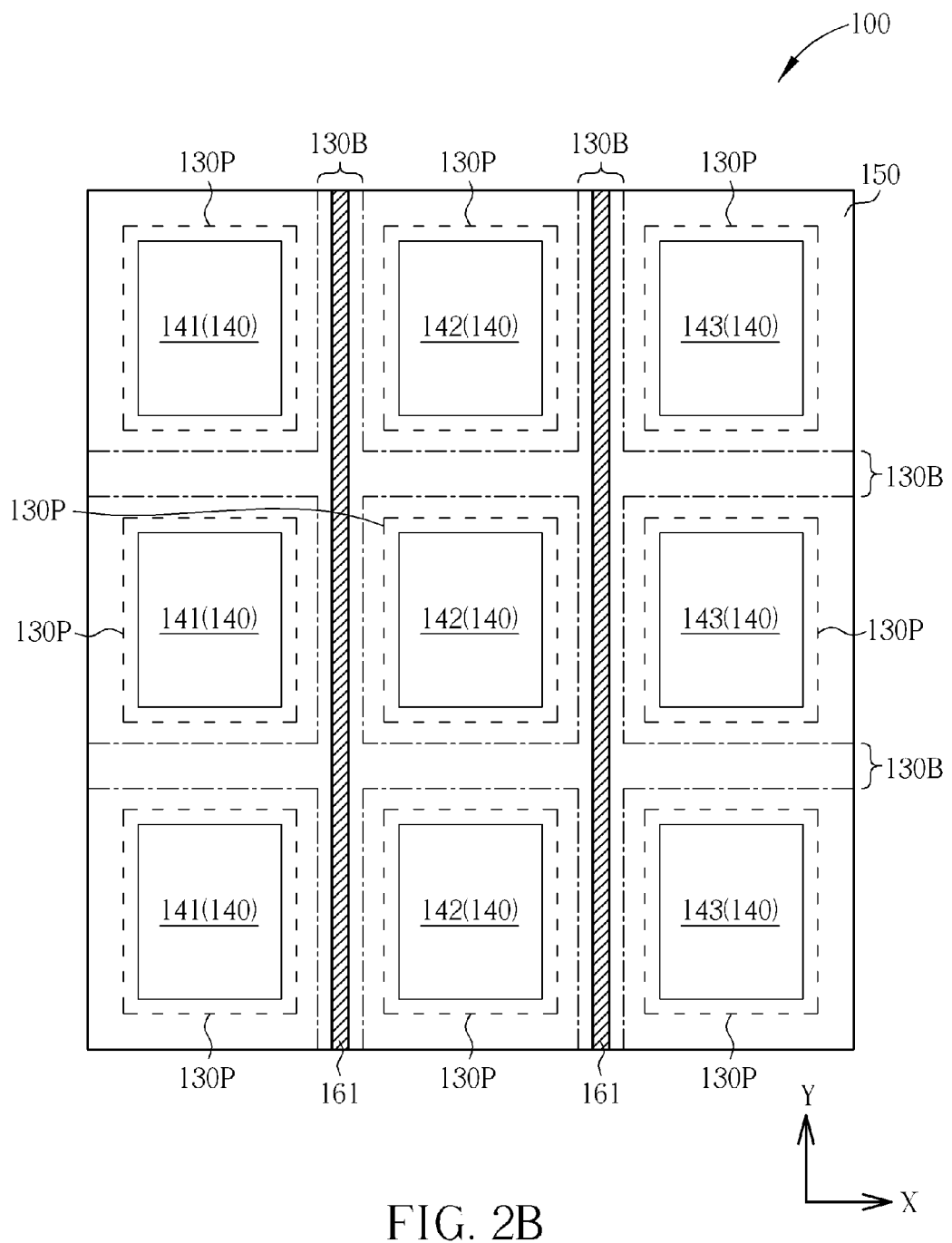
FIG. 2B is a schematic diagram illustrating an auxiliary electrode of a display panel according to another preferred exemplary embodiment of the present invention.
Figure 2C:
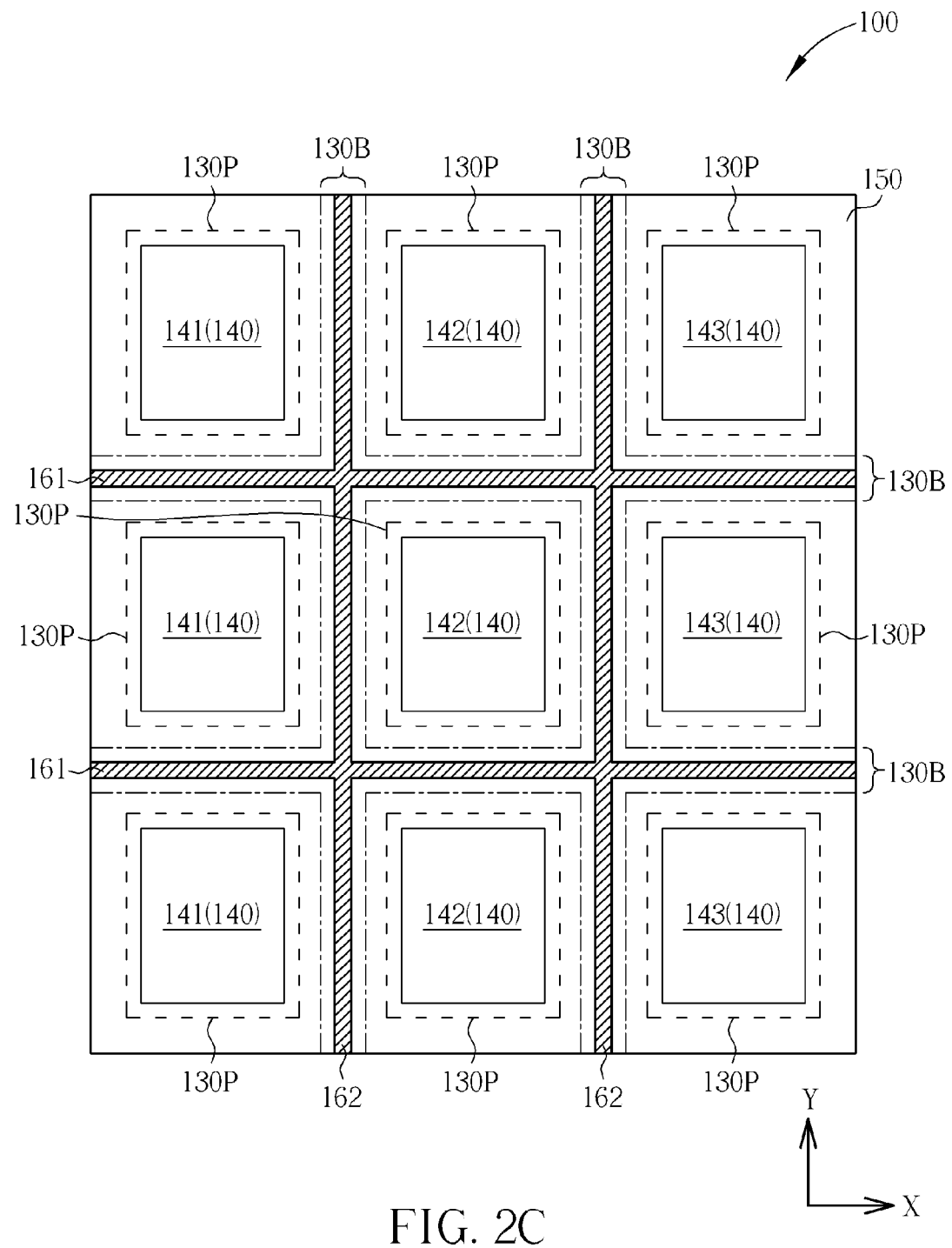
FIG. 2C is a schematic diagram illustrating an auxiliary electrode of a display panel according to further another preferred exemplary embodiment of the present invention.

Please refer to FIG. 1A, FIG. 1B, FIG. 2A, FIG. 2B, and FIG. 2C. FIG. 1A, FIG. 1B, and FIG. 2A are schematic diagrams illustrating a manufacturing method of a display panel according to a first preferred embodiment of the present invention. FIG. 1A and FIG. 1B are side-view diagrams, and FIG. 2A is a top-view diagram. FIG. 2B is a schematic diagram illustrating an auxiliary electrode of a display panel according to another preferred exemplary embodiment of the present invention. FIG. 2C is a schematic diagram illustrating an auxiliary electrode of a display panel according to further another preferred exemplary embodiment of the present invention. Please note that the figures are only for illustration and the figures may not be to scale. The scale may be further modified according to different design considerations. In this embodiment, the manufacturing method of the display panel includes the following steps. As shown in FIG. 1A, a substrate 110 is provided. The substrate 110 in this embodiment may include rigid substrate such as glass substrates or ceramic substrates, flexible substrates such as plastic substrates or thin metal substrates, or other substrates made of appropriate materials. A plurality of bottom electrodes 120 is formed on the substrate 110. The bottom electrode 120 may include transparent conductive materials such as indium tin oxide (ITO), indium zinc oxide (IZO), and aluminum zinc oxide (AZO), conductive materials such as silver (Ag), aluminum (Al), copper (Cu), magnesium (Mg), molybdenum (Mo), neodymium (Nd), aluminium neodymium (AlNd), a stack layer of the above-mentioned materials, or an alloy of the above-mentioned materials, but not limited thereto. An isolation layer 130 is then formed on the substrate 110. The isolation layer 130 may preferably include inorganic materials such as silicon nitride, silicon oxide, and silicon oxynitride, organic materials such as acrylic resin, or other appropriate materials. In this embodiment, the isolation layer 130 has a plurality of pixel region openings 130P and a buffer region 130B. The buffer region 130B is disposed between two adjacent pixel region openings 130P, and each of the pixel region openings 130P respectively exposes the corresponding bottom electrode 120, i.e. the isolation layer 130 partially overlaps the bottom electrodes 120. In other words, the isolation layer 130 may partially cover a peripheral region of each of the bottom electrodes 120 in a direction Z perpendicular to the substrate 110, and successive light emitting layers (not shown in FIG. 1A) may be formed correspondingly to the bottom electrodes 120, but the present invention is not limited to this, and the isolation layer 130 may be formed without covering the bottom electrodes 120 according to other considerations in other preferred embodiments. It is worth noting that, in this embodiment, a plurality of pixel controlling units (not shown in FIG. 1A) may be selectively formed on the substrate 110 and be electrically connected to the corresponding bottom electrodes 120, but not limited thereto.

As shown in FIG. 1B, a plurality of light emitting layer 140 are formed in the pixel region openings 130P. The light emitting layer 140 in this embodiment may include organic light emitting materials, but not limited thereto. The light emitting layer 140 may be formed by deposition process such as thermal deposition, printing process such as inkjet printing, nozzle printing, and transfer printing, or other appropriate methods. It is worth noting that the buffer region 130B of the isolation layer 130 may be employed to prevent contaminations from occurring during the formation of the light emitting layers 140 with different components or different colors in two adjacent pixel region openings 130P, and the yield of the related processes may therefore be enhanced. After forming the light emitting layers 140, a top electrode 150 is formed to cover the light emitting layers 140, the isolation layer 130, the pixel region openings 130P and the buffer region 130B. The top electrode 150 may include transparent conductive materials such as ITO, IZO, AZO, conductive materials such as Ag, Al, Cu, Mg, Mo, Nd, a stack layer of the above-mentioned materials, or an alloy of the above-mentioned materials, but not limited thereto. Subsequently, a first auxiliary electrode 161 is formed in the buffer region 130B, and the first auxiliary electrode 161 is then electrically connected to the top electrode 150. The first auxiliary electrode 161 may preferably include conductive materials with low electrical resistivity, such as Ag, Al, Cu, Mg, Mo, Nd, a stack layer of the above-mentioned materials, or an alloy of the above-mentioned materials, but not limited thereto. In addition, the first auxiliary electrode 161 may be formed by deposition process such as thermal deposition, inkjet printing, nozzle printing, or transfer printing, but not limited thereto. It is worth noting that the buffer region 130B is defined by the isolation layer 130 before forming the first auxiliary electrode 161, the first auxiliary electrode 161 may then be more conveniently formed by printing processes such as inkjet printing, nozzle printing, or transfer printing in the buffer region 130B, and the related processes may be accordingly simplified. A display panel 100 as shown in FIG. 1B may be formed after the process steps described above. Problems, such as internal resistance (IR) drop, which may arise when the top electrode 150 is made of thin metal layers or transparent conductive layers with higher electrical resistance for presenting higher light transmittance, may be overcome by the first auxiliary electrode 161 with lower electrical resistance and electrically connected to the top electrode 150. Additionally, as shown in FIG. 2A, each of the pixel region openings 130P has a first direction X and a second direction Y. In this embodiment, the first direction X is a shorter axis direction of the pixel region opening 130P and the second direction Y is a longer axis direction of the pixel region opening 130P, but not limited thereto. The first auxiliary electrode 161 may preferably extend along the first direction X in this embodiment.

As shown in FIG. 2B, in another preferred exemplary embodiment of the present invention, the first auxiliary electrode 161 may preferably extend along the second direction Y according to other design considerations. Additionally, as shown in FIG. 2C, in further another preferred exemplary embodiment of the present invention, the display panel 100 may include first auxiliary electrodes 161 and second auxiliary electrodes 162. The first auxiliary electrodes 161 and the second auxiliary electrodes 162 are formed in the buffer region 130B to electrically connect the first auxiliary electrodes 161 to the top electrode 150 and to electrically connect the second auxiliary electrodes 162 to the top electrode 150. The second auxiliary electrode 162 extends along the second direction Y, and the first auxiliary electrode 161 extends along the first direction X. The first auxiliary electrodes 161 and the second auxiliary electrodes 162 are arranged in an array configuration. The material properties and forming method of the second auxiliary electrode 162 are similar to those of the first auxiliary electrode 161 and will not be redundantly described. The IR drop issue may be further improved by forming the first auxiliary electrodes 161 and the second auxiliary electrodes 162. Additionally, as shown in FIG. 2B, a part of the buffer region 130B may selectively have no auxiliary electrode disposed therein for other considerations. In other words, the first auxiliary electrodes 161 or the second auxiliary electrodes 162 may be selectively disposed in only a part of the buffer region 130B.

Please refer to FIG. 1B, FIG. 2A, FIG. 2B, and FIG. 2C again. As shown in FIG. 1B, a display panel 100 is provided in this embodiment. The display panel 100 includes a substrate 110, a plurality of bottom electrodes 120, an isolation layer 130, a plurality of light emitting layers 140, a top electrode 150, and a first auxiliary electrode 161. The bottom electrodes 120 and the isolation layer 130 are disposed on the substrate 110. The isolation layer 130 partially overlaps each of the bottom electrodes 120. More specifically, in this embodiment, the isolation layer 130 may partially cover a peripheral region of each of the bottom electrodes 120 in the direction Z perpendicular to the substrate 110, but the present invention is not limited to this. In other preferred embodiments of the present invention, the isolation layer 130 may partially cover the bottom electrodes 120 in other ways or the isolation layer 130 may not cover the bottom electrodes 120 at all for other considerations. Additionally, the isolation layer 130 has a plurality of pixel region openings 130P and a buffer region 130B. Each of the pixel region openings 130P is disposed correspondingly to each of the bottom electrodes 120, and each of the pixel region openings 130P respectively exposes the corresponding bottom electrode 120. The buffer region 130B is disposed between two adjacent pixel region openings 130P. The light emitting layers 140 are respectively disposed on the corresponding bottom electrodes 120, and each of the light emitting layers 140 is disposed in the corresponding pixel region opening 130P. The top electrode 150 is disposed on the substrate 110. The top electrode 150 covers the light emitting layers 140, the isolation layer 130, the pixel region openings 130P, and the buffer region 130B. The first auxiliary electrode 161 is disposed in the buffer region 130B. In this embodiment, the first auxiliary electrode 161 is disposed on the top electrode 150, and the first auxiliary electrode 161 is electrically connected to the top electrode 150. The first auxiliary electrode 161 is preferably formed by conductive materials with lower electrical resistivity, but not limited thereto. The issue of IR drop, which may arise when the top electrode 150 is made of thin metal layers or transparent conductive layers with higher electrical resistance for providing higher light transmittance, may be improved by the first auxiliary electrode 161 with lower electrical resistance and electrically connected to the top electrode 150. As shown in FIG. 2A, each of the pixel region openings 130P has a first direction X and a second direction Y. The first auxiliary electrode 161 in this embodiment extends along the first direction X, but not limited thereto. In other preferred embodiments of the present invention, the first auxiliary electrode 161 may extend along the second direction Y, as shown in FIG. 2B. As shown in FIG. 2C, in another preferred exemplary embodiment of the present invention, the display panel 100 may include first auxiliary electrodes 161 and second auxiliary electrodes 162. The first auxiliary electrodes 161 and the second auxiliary electrodes 162 are disposed in the buffer region 130B, and the first auxiliary electrodes 161 and the second auxiliary electrodes 162 are electrically connected to the top electrode 150. The second auxiliary electrode 162 extends along the second direction Y, and the first auxiliary electrode 161 extends along the first direction X. The first auxiliary electrodes 161 and the second auxiliary electrodes 162 are arranged in an array configuration, but not limited thereto.

The material properties of the components in the display panel 100 of this embodiment have been described in the manufacturing method and will not be redundantly described. It is worth noting that the light emitting layers 140 disposed in two adjacent pixel region openings 130P may be used to generate light with different colors by modifying the material components of each light emitting layer 140 in the display panel 100 of the present embodiment. For example, as shown in FIG. 2A, the light emitting layers 140 in this embodiment may include a first light emitting layer 141, a second light emitting layer 142, a third light emitting layer 143 alternately disposed in different pixel region openings 130P along the first direction X, but the present invention is not limited to this, and the allocation and alignment approach of the first light emitting layer 141, the second light emitting layer 142, and the third light emitting layer 143 may be further modified according to different considerations. By modifying the components in each of the light emitting layers 140, the first light emitting layer 141 may be used to generate light such as red light, the second light emitting layer 142 may be used to generate light such as green light, and the third light emitting layer 143 may be used to generate light such as blue light, but not limited thereto. The light generated from the first light emitting layer 141, the second light emitting layer 142, and the third light emitting layer 143 may be mixed to display a full color effect. Additionally, as shown in FIG. 1B, the light transmittance of the bottom electrodes 120 and the top electrode 150 may be modified by adjusting the material components and the thicknesses of the bottom electrodes 120 and the top electrode 150, and a reflecting layer (not shown) may be selectively disposed in the display panel 100 to provide a top emission display effect or a bottom emission display effect.

The following description will detail the different embodiments of the display panel in the present invention. To simplify the description, the identical components in each of the following embodiments are marked with identical symbols. In order to compare more easily the differences between the embodiments, the following description will detail the dissimilarities among different embodiments and the identical features will not be redundantly described.

Figure 3:
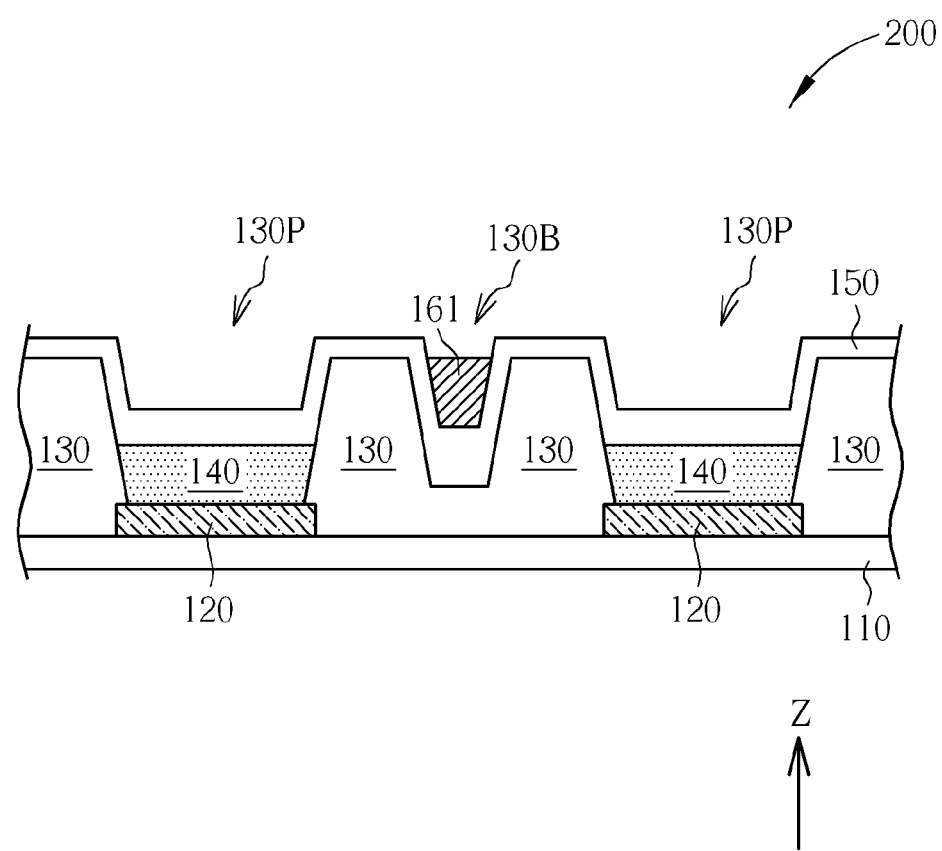
FIG. 3 is a schematic diagram illustrating a display panel according to a second preferred embodiment of the present invention.

Please refer to FIG. 3. FIG. 3 is a schematic diagram illustrating a display panel according to a second preferred embodiment of the present invention. As shown in FIG. 3, the difference between a display panel 200 of this embodiment and the display panel 100 of the first preferred embodiment is that the buffer region 130B in this embodiment does not expose the substrate 110. In other words, the top electrode 150 subsequently formed in the buffer region 130B does not contact the substrate 110. Apart from the characteristic that the buffer region 130B does not expose the substrate 110, the allocations and the material properties of other components in this embodiment are similar to those of the display panel 100 of the first preferred embodiment detailed above and will not be redundantly described.

Figure 4:
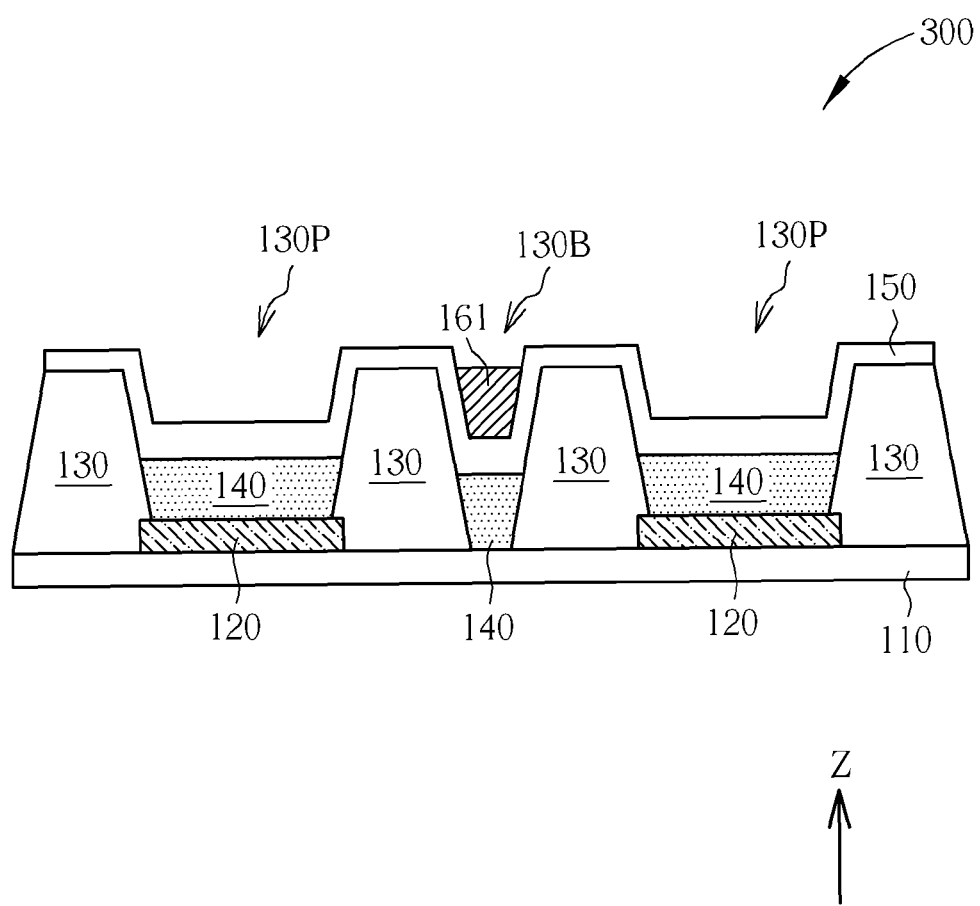
FIG. 4 is a schematic diagram illustrating a display panel according to a third preferred embodiment of the present invention.

Please refer to FIG. 4. FIG. 4 is a schematic diagram illustrating a display panel according to a third preferred embodiment of the present invention. As shown in FIG. 4, in a display panel 300 of the present embodiment, some of the light emitting layer 140 may be disposed in the buffer region 130B, and the light emitting layer 140 in the buffer region 130B is disposed under the top electrode 150. More specifically, as described above, the buffer region 130B of the isolation layer 130 may be employed to prevent contaminations from occurring during forming the light emitting layers 140 with different components or different colors in two adjacent pixel region openings 130P. For example, when forming the light emitting layers 140 in the pixel region openings 130P by inkjet printing, excess materials of the light emitting layer 140 may overflow the pixel regions openings 130P into the buffer region 130B, and a contamination crossing two adjacent pixel region openings may therefore be avoided. Apart from the characteristic that some of the light emitting layers 140 may be disposed in the buffer region 130B, the allocations and the material properties of other components in this embodiment are similar to those of the display panel 100 of the first preferred embodiment detailed above and will not be redundantly described.

Figure 5:
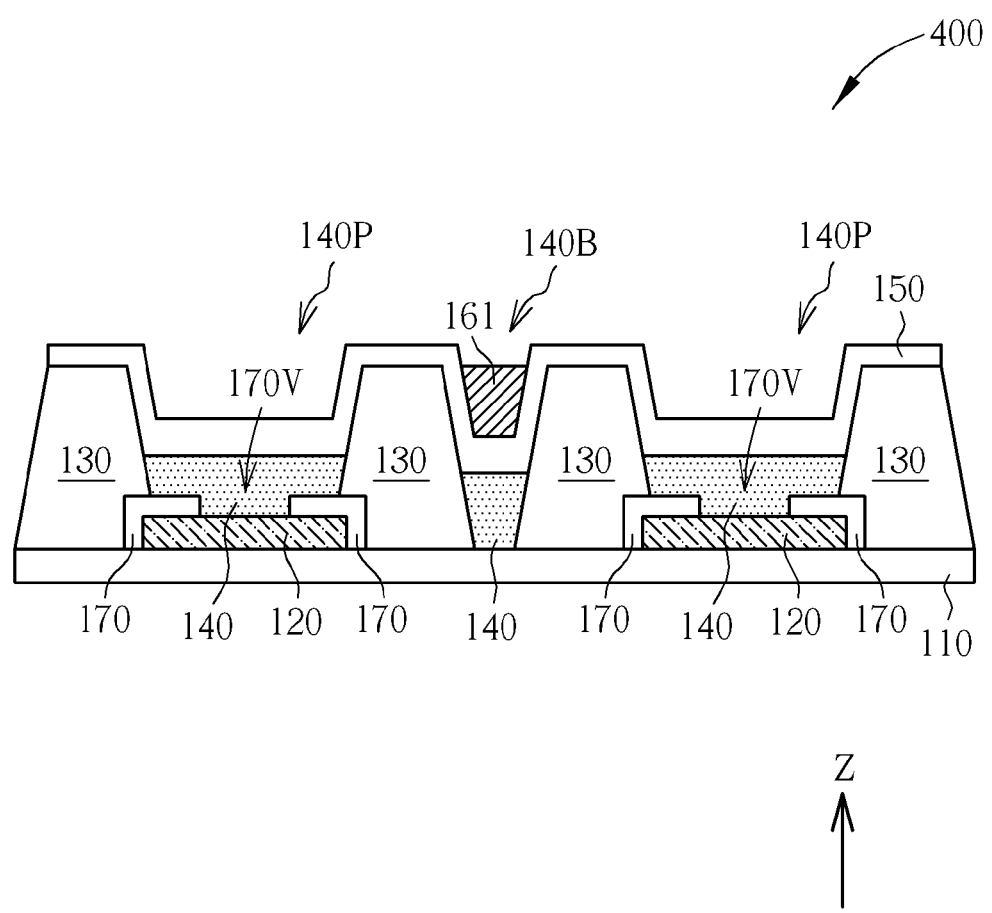
FIG. 5 is a schematic diagram illustrating a display panel according to a fourth preferred embodiment of the present invention.

Please refer to FIG. 5. FIG. 5 is a schematic diagram illustrating a display panel according to a fourth preferred embodiment of the present invention. As shown in FIG. 5, compared to the manufacturing method of the display panel in the first preferred embodiment, the manufacturing method of a display panel 400 in this embodiment further includes forming a protection layer 170 on the substrate 110 before forming the isolation layer 130. The protection layer 170 partially covers each of the bottom electrodes 120. The protection layer 170 has a plurality of openings 170V partially exposing each of the bottom electrodes 120. The protection layer 170 may preferably include oxide such as silicon oxide, nitride such as silicon nitride, oxynitride such as silicon oxynitride, or other appropriate protective materials to compensate for the isolation layer 130 that has insufficient protection performance. Apart from the characteristic that the display panel 400 of this embodiment further includes a protection layer 170 disposed between the isolation layer 130 and the bottom electrodes 120, the allocations and the material properties of other components in this embodiment are similar to those of the display panel 100 of the first preferred embodiment detailed above and will not be redundantly described.

Figure 6:
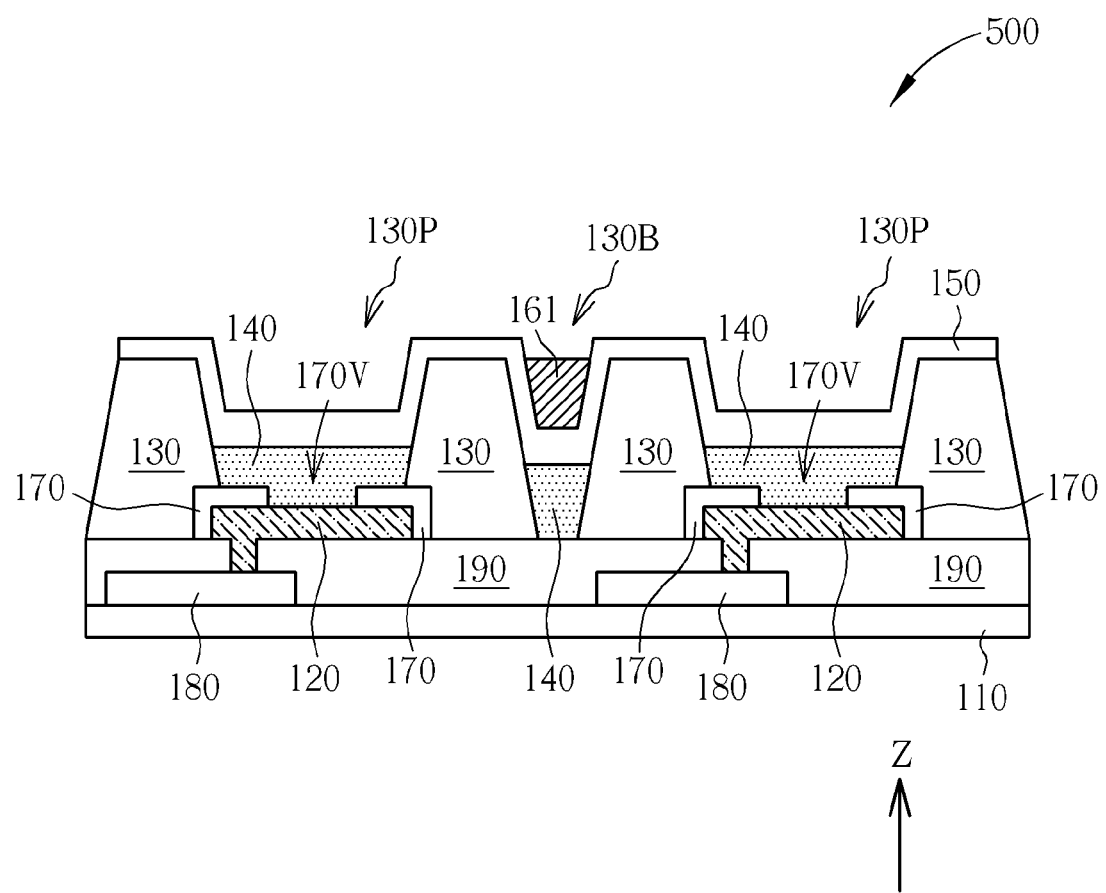
FIG. 6 is a schematic diagram illustrating a display panel according to a fifth preferred embodiment of the present invention.

Please refer to FIG. 6. FIG. 6 is a schematic diagram illustrating a display panel according to a fifth preferred embodiment of the present invention. As shown in FIG. 6, compared to the manufacturing method of the display panel in the fourth preferred embodiment described above, the manufacturing method of a display panel 500 in this embodiment further includes forming a plurality of pixel controlling units 180 and an insulating layer 190 on the substrate 110. The insulating layer 190 covers the pixel controlling units 180 and protects the pixel controlling units 180. In this embodiment, each of the bottom electrodes 120 penetrates the insulating layer 190 in order to be electrically connected to the corresponding pixel controlling unit 180. In other words, each of the pixel controlling units 180 is electrically connected to the corresponding bottom electrode 120 to control the condition of the bottom electrodes 120. The insulating layer 190 may preferably include oxide such as silicon oxide, nitride such as silicon nitride, oxynitride such as silicon oxynitride, or other appropriate insulating materials. Each of the pixel controlling units 180 may include an amorphous silicon thin film transistor (a-Si TFT), a poly silicon thin film transistor (poly-Si TFT), or an oxide semiconductor thin film transistor, but the present invention is not limited to this, and other appropriate controlling units may also be employed to control the condition of the bottom electrodes 120 and the corresponding light emitting layers 140. Apart from the characteristic that the display panel 500 of this embodiment further includes an insulating layer 190 and a plurality of pixel controlling units 180 disposed on the substrate 110, the allocations and the material properties of other components in this embodiment are similar to those of the display panel 400 of the fourth preferred embodiment detailed above, and will not be redundantly described.

Figure 7:
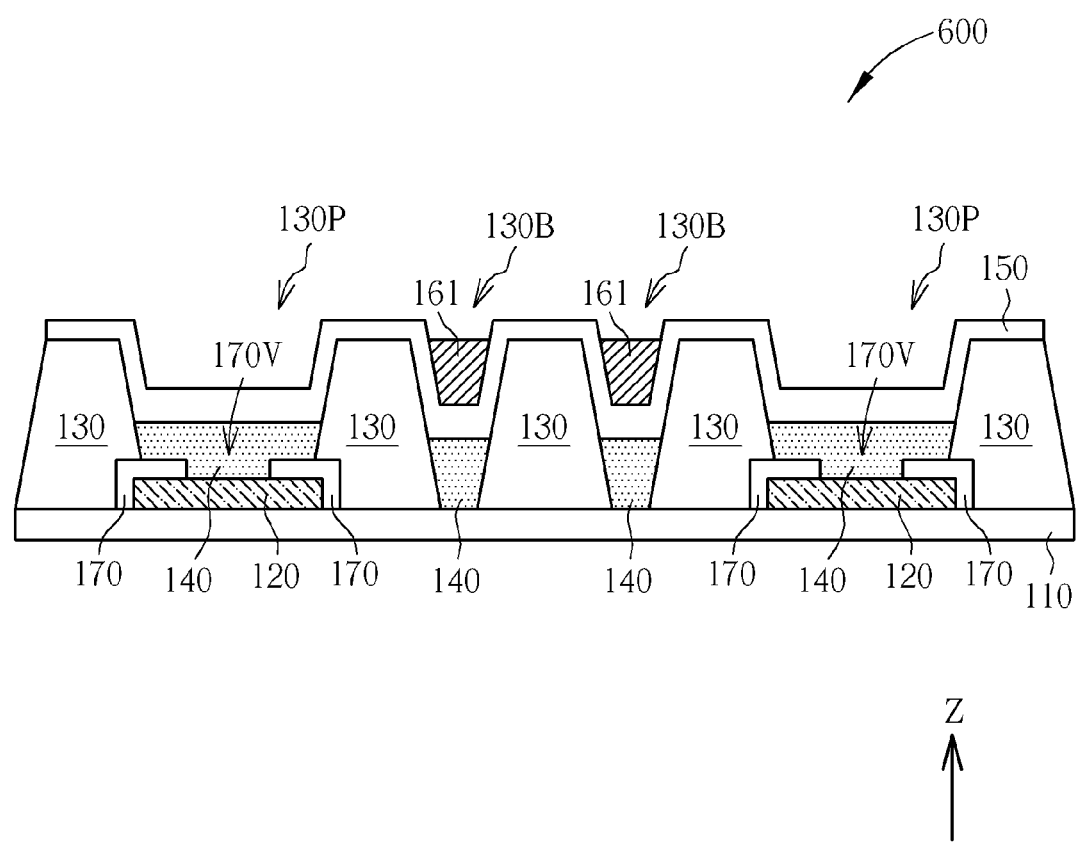
FIG. 7 is a schematic diagram illustrating a display panel according to a sixth preferred embodiment of the present invention.

Please refer to FIG. 7. FIG. 7 is a schematic diagram illustrating a display panel according to a sixth preferred embodiment of the present invention. As shown in FIG. 7, compared to the fourth preferred embodiment described above, a plurality of first auxiliary electrodes 161 and a plurality of buffer regions 130B are disposed between two adjacent pixel region openings 130P in a display panel 600 of the present embodiment. Each of the first auxiliary electrodes 161 is disposed in the buffer regions 130B. The contamination problems between the light emitting layers 140 may be further ameliorated by increasing the amount of the buffer regions 130B, and the IR drop issue of the top electrode 150 may also be improved by increasing the amount of the first auxiliary electrodes 161. Apart from the characteristic that the amounts of the first auxiliary electrodes 161 and the buffer regions 130B are increased between two adjacent pixel region openings 130P, the allocations and the material properties of other components in this embodiment are similar to those of the display panel 400 of the fourth preferred embodiment detailed above and will not be redundantly described.

It is worth noting that the adjustment in the extending direction of the first auxiliary electrode and the second auxiliary electrode described in the first preferred embodiment may also be employed in the second preferred embodiment, in the third preferred embodiment, in the fourth preferred embodiment, in the fifth preferred embodiment, and in the sixth preferred embodiment for further improving the IR drop issue.

To summarize the above descriptions, in the display panel and the manufacturing method thereof in the present invention, the auxiliary electrode is employed to overcome the IR drop issue which may occur in the top electrode, and the luminance uniformity of the display panel may be accordingly improved. Meanwhile, the complicacy of the manufacturing process may be lowered due to the auxiliary electrode of the present invention being formed in the buffer region defined by the isolation layer, and the purpose of process simplification may accordingly be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display panel, comprising:
a substrate;
a plurality of bottom electrodes, disposed on the substrate;
an isolation layer, disposed on the substrate, wherein the isolation layer has a plurality of pixel region openings and at least one buffer region, each of the pixel region openings respectively exposes the corresponding bottom electrode, and the buffer region is disposed between two adjacent pixel region openings, wherein the buffer region has a concave part;
a plurality of light emitting layers, respectively disposed on the corresponding bottom electrodes;
a top electrode, disposed on the substrate, wherein the top electrode covers the light emitting layers and the isolation layer, and the buffer region is at least partially filled with the top electrode; and
at least one first auxiliary electrode, disposed in the buffer region.

2. The display panel of claim 1, wherein the first auxiliary electrode is electrically connected to the top electrode.

3. The display panel of claim 1, wherein the first auxiliary electrode is disposed on the top electrode.

4. The display panel of claim 1, wherein each of the light emitting layers is disposed in the corresponding pixel region opening.

5. The display panel of claim 1, wherein the isolation layer partially covers each of the bottom electrodes.

6. The display panel of claim 1, wherein the isolation layer partially overlaps the bottom electrodes.

7. The display panel of claim 1, further comprising a protection layer, disposed between the isolation layer and the bottom electrodes, wherein the protection layer has a plurality of openings partially exposing each of the bottom electrodes.

8. The display panel of claim 1, further comprising a plurality of pixel controlling units, disposed on the substrate, wherein each of the pixel controlling units is electrically connected to the corresponding bottom electrode.

9. The display panel of claim 1, wherein each of the pixel region openings has a first direction and a second direction, and the first auxiliary electrode extends along the first direction.

10. The display panel of claim 9, further comprising at least one second auxiliary electrode, disposed in the buffer region and electrically connected to the top electrode, wherein the second auxiliary electrode extends along the second direction, and the first auxiliary electrode and the second auxiliary electrode are arranged in an array configuration.

11. A manufacturing method of a display panel, comprising:
  providing a substrate;
  forming a plurality of bottom electrodes on the substrate;
  forming an isolation layer on the substrate, wherein the isolation layer has a plurality of pixel region openings and at least one buffer region, each of the pixel region openings respectively exposes the corresponding bottom electrode, and the buffer region is disposed between two adjacent pixel region openings, wherein the buffer region has a concave part;
  forming a plurality of light emitting layers in the pixel region openings;
  forming a top electrode, the top electrode covering the light emitting layers and the isolation layer, and the buffer region is at least partially filled with the top electrode; and
  forming at least one first auxiliary electrode in the buffer region, the first auxiliary electrode being electrically connected to the top electrode.

12. The manufacturing method of claim 11, wherein the first auxiliary electrode is formed by inkjet printing, nozzle printing, or transfer printing.

13. The manufacturing method of claim 11, further comprising forming a plurality of pixel controlling units on the substrate, wherein the each of the pixel controlling units is electrically connected to the corresponding bottom electrode.

14. The manufacturing method of claim 11, wherein the isolation layer partially covers each of the bottom electrodes.

15. The manufacturing method of claim 11, each of the pixel region openings has a first direction and a second direction, and the first auxiliary electrode extends along the first direction.

16. The manufacturing method of claim 11, further comprising forming at least one second auxiliary electrode in the buffer region, the second auxiliary electrode being electrically connected to the top electrode, wherein the first auxiliary electrode and the second auxiliary electrode are arranged in an array configuration.

17. The display panel of claim 1, wherein the buffer region exposes the substrate.

18. The display panel of claim 1, wherein each of the light emitting layers is further partially disposed in the buffer region, and the light emitting layer in the buffer region is disposed between two adjacent bottom electrodes.

19. The display panel of claim 18, wherein the top electrode in the buffer region is disposed between the first auxiliary electrode and the light emitting layer in the buffer region.

20. The display panel of claim 1, wherein the first auxiliary electrode and the bottom electrodes are disposed at different layer-levels.

21. The manufacturing method of claim 11, wherein the buffer region exposes the substrate.

22. The manufacturing method of claim 11, wherein each of the light emitting layers is further partially disposed in the buffer region, and the light emitting layer in the buffer region is disposed between two adjacent bottom electrodes.

23. The manufacturing method of claim 22, wherein the top electrode in the buffer region is disposed between the first auxiliary electrode and the light emitting layer in the buffer region.

24. The manufacturing method of claim 11, wherein the first auxiliary electrode and the bottom electrodes are disposed at different layer-levels.

* * * * *